(12) United States Patent
Mori et al.

(10) Patent No.: US 10,927,476 B2
(45) Date of Patent: Feb. 23, 2021

(54) PRODUCTION METHOD FOR GROUP III NITRIDE CRYSTAL

(71) Applicants: OSAKA UNIVERSITY, Osaka (JP); Panasonic Corporation, Osaka (JP)

(72) Inventors: Yusuke Mori, Osaka (JP); Masayuki Imanishi, Osaka (JP); Masashi Yoshimura, Osaka (JP); Kousuke Murakami, Osaka (JP); Yoshio Okayama, Osaka (JP)

(73) Assignees: OSAKA UNIVERSITY, Osaka (JP); PANASONIC CORPORATION, Osaka (JP)

( * ) Notice: Subject to any disclaimer, the term of this patent is extended or adjusted under 35 U.S.C. 154(b) by 165 days.

(21) Appl. No.: 16/243,321

(22) Filed: Jan. 9, 2019

(65) Prior Publication Data

US 2019/0271096 A1   Sep. 5, 2019

(30) Foreign Application Priority Data

Mar. 2, 2018   (JP) ................. 2018-037500

(51) Int. Cl.
  *C30B 9/02*   (2006.01)
  *C30B 19/02*   (2006.01)
  *C30B 19/10*   (2006.01)
  *C30B 29/40*   (2006.01)

(52) U.S. Cl.
  CPC .............. *C30B 19/02* (2013.01); *C30B 19/10* (2013.01); *C30B 29/406* (2013.01)

(58) Field of Classification Search
  CPC ..... C30B 9/00; C30B 9/02; C30B 9/06; C30B 29/406
  See application file for complete search history.

(56) References Cited

U.S. PATENT DOCUMENTS

| 9,893,234 B2* | 2/2018 | Watanabe ......... H01L 21/02628 |
| 10,329,687 B2* | 6/2019 | Moriyama ............. C30B 15/04 |
| 2004/0183090 A1 | 9/2004 | Kitaoka et al. |
| 2010/0059717 A1 | 3/2010 | Mori et al. |
| 2014/0328742 A1 | 11/2014 | Mori et al. |

FOREIGN PATENT DOCUMENTS

| JP | 4538596 | 9/2010 |
| JP | 4588340 | 12/2010 |
| JP | 5904421 | 4/2016 |

\* cited by examiner

*Primary Examiner* — Robert M Kunemund
(74) *Attorney, Agent, or Firm* — Wenderoth, Lind & Ponack, L.L.P.

(57) ABSTRACT

A production method for a group III nitride crystal, the production method includes: preparing a plurality of group III nitride pieces as a plurality of seed crystals on a substrate, and growing a group III nitride crystal by bringing a surface of each of the seed crystals into contact with a melt that comprises at least one group III element selected from gallium, aluminum, and indium, and an alkali metal in an atmosphere comprising nitrogen, and thereby reacting the group III element and the nitrogen in the melt, wherein the step of growing a group III nitride crystal includes: growing a plurality of first group III nitride crystals whose cross-sections each have a triangular shape or a trapezoidal shape, from the plurality of seed crystals; and growing second group III nitride crystals each in a gap among the plurality of first group III nitride crystals.

11 Claims, 6 Drawing Sheets

PRODUCTION METHOD FOR GROUP III NITRIDE CRYSTAL

CROSS-REFERENCE TO RELATED APPLICATIONS

This application claims priority of Japanese Patent Application No. 2018-37500 filed on Mar. 2, 2018, the contents of which is incorporated herein by reference.

BACKGROUND OF THE INVENTION

(1) Field of the Invention

The present disclosure relates to a production method for a group III nitride crystal.

(2) Description of the Related Art

A crystal of a Group III nitride such as GaN has recently drawn attention as a material of a light-emitting diode and the like. A flux method is known as one of the production methods for this crystal of a group III nitride, according to which a high quality crystal including few crystal faults (dislocations) is grown by reacting a group III element and nitrogen with each other in a melt of an alkali metal such as Na (a flux) (see, e.g., Japanese Patent Publication No. 4538596). A method is disclosed according to which, to acquire a large-sized group III nitride crystal, plural portions of a group III nitride layer formed on a sapphire substrate using a metal-organic chemical vapor deposition (MOCVD) or the like are each selected as a seed crystal and these seed crystals are brought into contact with an alkali metal melt to grow a group III nitride crystal (see, e.g., Japanese Patent Publication Nos. 4588340 and 5904421).

As depicted in FIG. 9, when the traditional production method disclosed in the above '421 publication is used, group III nitride crystals 3a grown from the plural seed crystals 2 are collectively coupled to each other to be grown and the growth therefore takes place in a growth mode for an inclined surface such as a (10-11) surface to be externally exposed. As to the acquired group III nitride crystals 3a each having a pyramid-shape, the amount of impurities captured in the crystals is therefore large and a problem arises that the crystals are colored. The case is present where a group III nitride crystal layer necessary for fabrication of a device is formed using a hydride vapor phase epitaxy (HVPE) method or the MOCVD method on a group III nitride crystal that is formed using the flux method. In this case, mismatching between the crystal lattices occurs due to the difference in the amount of the contained impurities and a problem therefore arises that no excellent group III nitride crystal layer can be formed. Recesses and protrusions are relatively large on the surface of the group III nitride crystal formed using the flux method. The amount of processing work for the surface is therefore increased to produce a group III nitride crystal substrate whose surface is flat, and problems therefore arise such as a reduced yield and an increased cost.

SUMMARY

One non-limiting and exemplary embodiment provides a production method for a group III nitride crystal that has high quality and a large size, and whose surface is flat.

In one general aspect, the techniques disclosed here feature: a production method for a group III nitride crystal includes:

preparing a plurality of group III nitride pieces as a plurality of seed crystals on a substrate; and growing a group III nitride crystal by bringing the surface of each of the seed crystals into contact with a melt that includes at least one group III element selected from gallium, aluminum, and indium, and an alkali metal in an atmosphere including nitrogen, and thereby reacting the group III element and the nitrogen with each other in the melt, of which the step of growing a group III nitride crystal includes:

growing a plurality of first group III nitride crystals whose cross-sections each have a triangular shape or a trapezoidal shape, on the basis of the plurality of seed crystals; and growing second group III nitride crystals each in a gap among the plurality of first group III nitride crystals.

In the production method for a group III nitride crystal according to the present disclosure, the step of growing a group III nitride crystal includes the first crystal growth step of growing the plural first group III nitride crystals and the second crystal growth step of growing the second group III nitride crystals each in a gap among the plural first group III nitride crystals. A flat group III nitride crystal can thereby be acquired by burying the gaps among the first group III crystals. Because the group III nitride crystals are grown on the basis of the plural seed crystals to be coupled with each other, a group III nitride crystal can be produced that has high quality and a large size, and whose surface is flat. In addition, any reduction of the yield and any increase of the production cost can be suppressed when a group III nitride crystal whose surface is flat is produced.

Additional benefits and advantages of the disclosed embodiments will be apparent from the specification and figures. The benefits and/or advantages may be individually provided by the various embodiments and features of the specification and drawings disclosure, and need not all be provided in order to obtain one or more of the same.

BRIEF DESCRIPTION OF THE DRAWINGS

The present disclosure will become readily understood from the following description of non-limiting and exemplary embodiments thereof made with reference to the accompanying drawings, in which like parts are designated by like reference numeral and in which.

DETAILED DESCRIPTION

Figure 1:
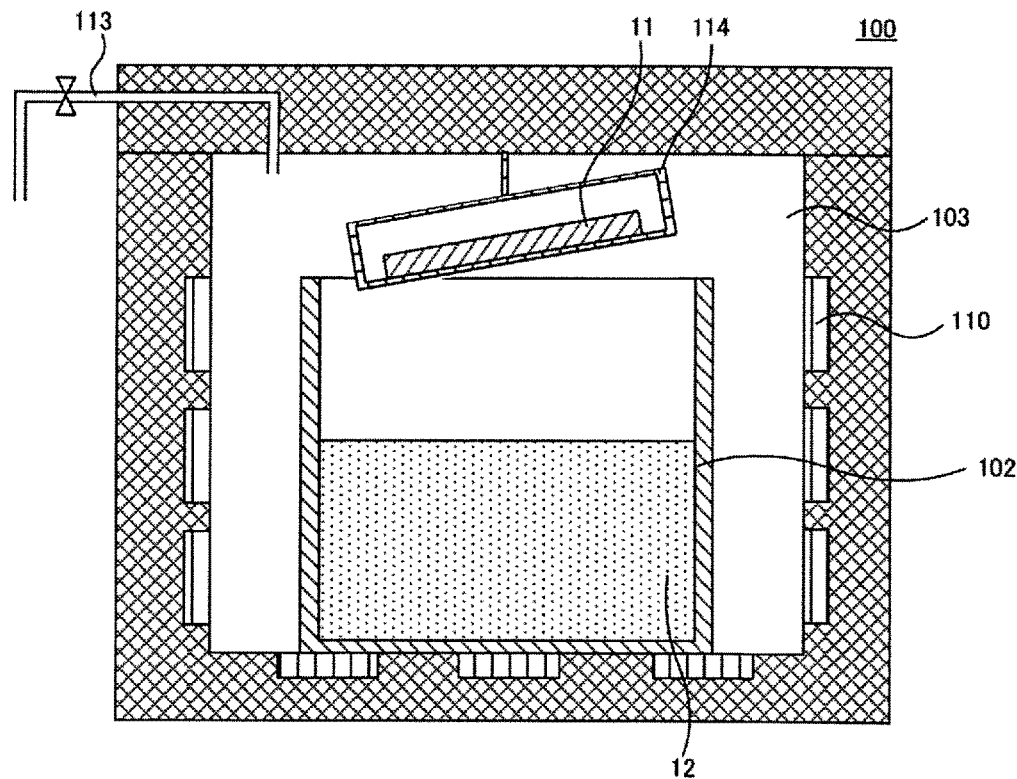
FIG. 1 is a schematic cross-sectional diagram of an example of a group III nitride crystal producing apparatus used in a first embodiment of the present disclosure, depicting the state thereof where a substrate is lifted up from a melt.

A production method for a group III nitride crystal according to a first aspect includes:

preparing a plurality of group III nitride pieces as a plurality of seed crystals on a substrate; and growing a group III nitride crystal by bringing the surface of each of the seed crystals into contact with a melt that includes at least one group III element selected from gallium, aluminum, and indium, and an alkali metal in an atmosphere including nitrogen, and thereby reacting the group III element and the nitrogen with each other in the melt, and is characterized in that the step of growing a group III nitride crystal includes:
growing a plurality of first group III nitride crystals whose cross-sections each have a triangular shape or a trapezoidal shape, on the basis of the plurality of seed crystals; and
growing second group III nitride crystals each in a gap among the plurality of first group III nitride crystals.

In the production method for a group III nitride crystal according to a second aspect, at the step of growing second group III nitride crystals, a plurality of group III nitride crystal layers may be formed on an inclined surface of each of the first group III nitride crystals formed at the step of growing a plurality of first group III nitride crystals, in the first aspect.

The production method for a group III nitride crystal according to a third aspect is characterized in that, at the step of growing first group III nitride crystals, the substrate is immersed in the melt and, at the step of growing second group III nitride crystals, the immersion of the substrate in the melt and lifting up thereof from the melt may be repeated for plural times, in the first or the second aspect.

In the production method for a group III nitride crystal according to a fourth aspect, at the step of growing second group III nitride crystals, the time period for the substrate to be immersed in the melt may be shorter than a time period for the substrate to be kept lifted up from the melt, in the third aspect.

In the production method for a group III nitride crystal according to a fifth aspect, at the step of growing second group III nitride crystals, the substrate may be lifted above and put down under the liquid level of the melt in the state where the substrate is inclined against the liquid level of the melt, in the third or the fourth aspect.

In the production method for a group III nitride crystal according to a sixth aspect, at the step of growing second group III nitride crystals, the substrate may be inclined against the liquid level of the melt at least once in the time period during which the substrate is kept lifted up from the melt, in the third or the fourth aspect.

In the production method for a group III nitride crystal according to a seventh aspect, at the step of growing second group III nitride crystals, a thickness of a coating film of the melt present on the substrate may be controlled to be a specific amount in the time period for the substrate to be kept lifted up from the melt, in the third or the fourth aspect.

In the production method for a group III nitride crystal according to a eighth aspect, the step of growing a group III nitride crystal may further include growing a third group III nitride crystal whose surface is flat, after the step of growing second group III nitride crystals, in any one aspect of the first to the seventh aspects.

In the production method for a group III nitride crystal according to a ninth aspect, at the step of growing a third group III nitride crystal, the substrate may be immersed in the melt, in the eighth aspect.

With the above configuration, the the step of growing a third group III nitride crystal is in a growth mode for a flat crystal surface, and the crystal faults can therefore be reduced in the acquired flat group III nitride crystal. In addition, the amount of the impurities captured in the crystal can be suppressed, and the problems of coloring and mismatching between the crystal lattices can thereby be solved.

The production method for a group III nitride crystal according to a tenth aspect may further include separating the group III nitride crystal and the substrate from each other in the vicinity of each of the seed crystals, after the step of growing a group III nitride crystal, in any one of the first to the ninth aspects.

In the production method for a group III nitride crystal according to an eleventh aspect, the step of growing a plurality of first group III nitride crystals may continuously be conducted until the plural first group III nitride crystals are coupled with each other in at least some of bottom face end portions, in any one of the first to the tenth aspects.

In the production method for a group III nitride crystal according to a twelfth aspect, the step of growing second group III nitride crystals may be conducted after the plural first group III nitride crystals are coupled with each other in at least some of the bottom face end portions, in any one of the first to the eleventh aspects.

The production method for a group III nitride crystal according to an embodiment of present disclosure will be described taking an example of the embodiment according to which a GaN crystal is produced as the group III nitride crystal. In the drawings, substantially same members are given the same reference numerals.

First Embodiment

Figure 2:
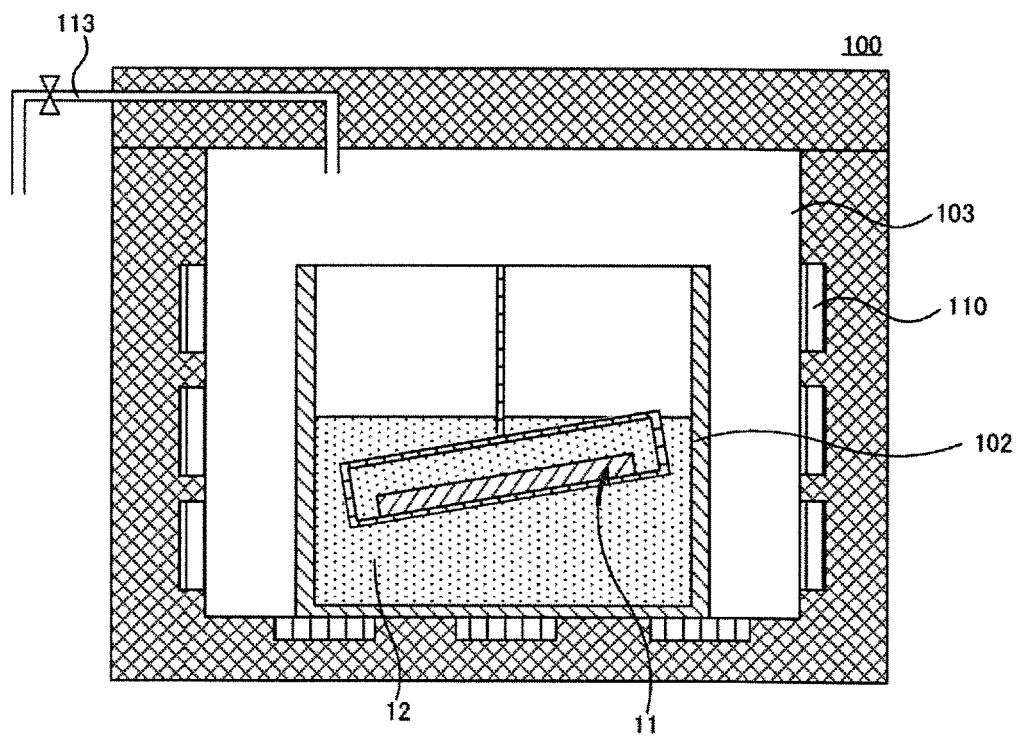
FIG. 2 is a schematic cross-sectional diagram of the state where the substrate is immersed in the melt in the producing apparatus for a group III nitride crystal of FIG. 1.

FIG. 1 is a schematic cross-sectional diagram of an example of a group III nitride crystal producing apparatus 100 used in a first embodiment of present disclosure, depicting the state thereof where a substrate 11 is lifted up from a melt 12. FIG. 2 is a schematic cross-sectional diagram of the state where the substrate 11 is immersed in the melt 12 in the group III nitride crystal producing apparatus 100 of FIG. 1. FIGS. 3 to 8 are schematic cross-sectional diagrams each of a step of the production method for a group III nitride crystal according to the first embodiment.

Figure 3:
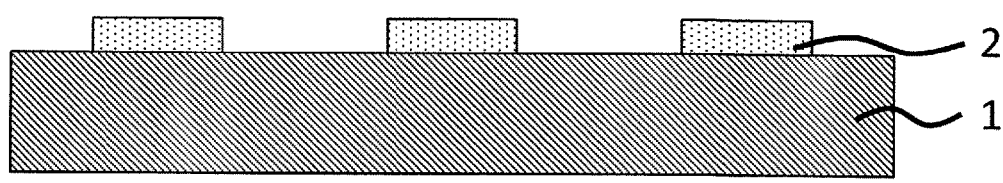
FIG. 3 is a schematic cross-sectional diagram of a step of a production method for a group III nitride crystal according to the first embodiment of present disclosure.
Figure 4:
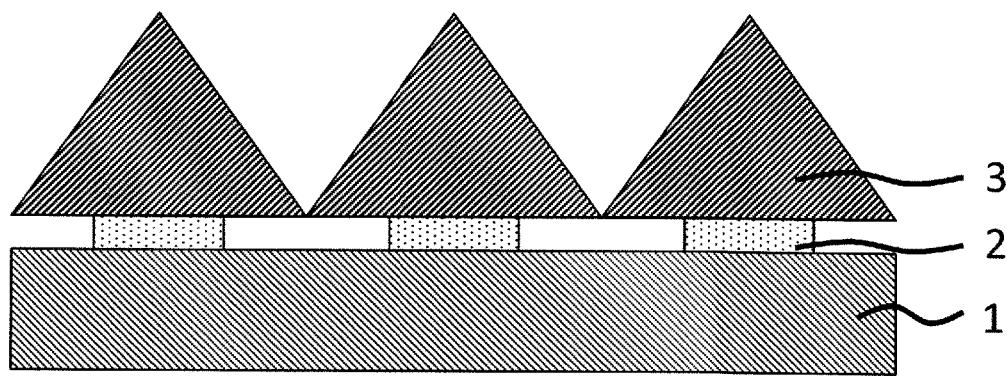
FIG. 4 is a schematic cross-sectional diagram of a step of the production method for a group III nitride crystal according to the first embodiment of present disclosure.
Figure 5:
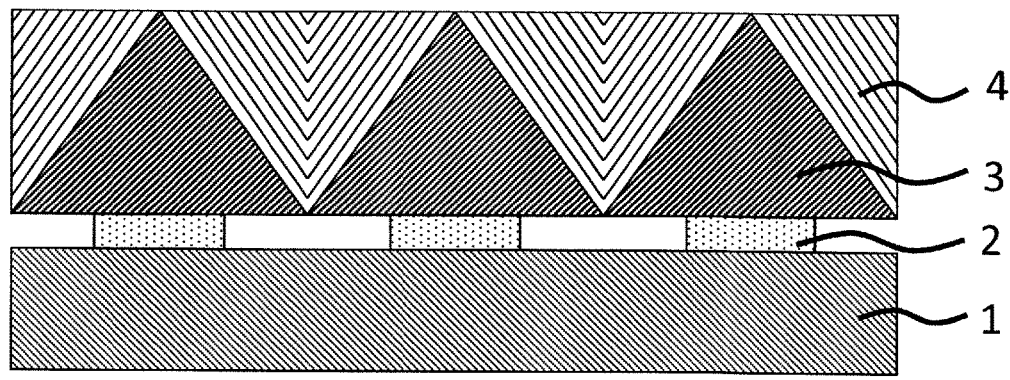
FIG. 5 is a schematic cross-sectional diagram of a step of the production method for a group III nitride crystal according to the first embodiment of present disclosure.

The production method for a group III nitride crystal according to the first embodiment includes a seed crystal preparation step of preparing a plurality of group III nitride pieces as a plurality of seed crystals (FIG. 3) and a crystal growth step of growing a group III nitride crystal (FIGS. 4 and 5). At the seed crystal preparation step, plural group III nitride pieces 2 as seed crystals are prepared on a substrate 1 (FIG. 3). At the crystal growth step, the surface of each of the plural seed crystals is brought into contact with the melt 12 that includes at least one group III element selected from gallium, aluminum, and indium, and an alkali metal in an atmosphere including nitrogen (FIG. 2). The group III element and the nitrogen are thereby reacted with each other in the melt to be grown into group III nitride crystals 3 and 4 (FIGS. 4 and 5). The crystal growth step includes a first crystal growth step of growing a plurality of first group III nitride crystals (FIG. 4) and a second crystal growth step of growing second group III nitride crystals (FIG. 5). At the first crystal growth step, the plural first group III nitride crystals 3 whose cross-sections each have a triangular shape or a trapezoidal shape are grown from the plural seed crystals 2 (FIG. 4). At the second crystal growth step, the plural second group III nitride crystals 4 are grown each in a gap among the plural first group III nitride crystals 3 (FIG. 5).

The flat group III nitride crystals 3 and 4 can thereby be acquired by burying the gaps among the first group III crystals. Because the group III nitride crystals 3 and 4 are grown from the plural seed crystals 2 to be coupled with each other, the group III nitride crystals 3 and 4 can be produced that each have high quality and a large size, and whose surfaces are flat. In addition, any reduction of the yield and any increase of the production cost can be suppressed when a group III nitride crystal whose surface is flat is produced.

Especially, at the first crystal growth step, the plural first group III nitride crystals 3 whose cross-sections each have a triangular shape or a trapezoidal shape, can be grown from the plural seed crystals 2 by immersing the substrate 11 in the melt 12 (FIGS. 2 and 4). At the second crystal growth step, the plural second group III nitride crystals 4 can be grown each in a gap among the plural first group III nitride crystals 3 (FIG. 5) by repeating for plural times the immersion of the substrate 11 in the melt 12 (FIG. 2) and the lifting up thereof from the melt 12 (FIG. 1).

The third crystal growth step (FIG. 6) of growing the third group III nitride crystal whose surface is flat may further be included after the second crystal growth step.

(Seed Crystal Preparation Step)

A substrate 1 made of sapphire is first prepared as a substrate for producing a crystal. The reason why sapphire is used is that the difference in each of the lattice constant and the coefficient of thermal expansion is relatively small between sapphire and GaN. In addition to sapphire, for example, SiC, GaAs, ScAlMgO$_4$, and the like are usable as a substrate. The thickness of the substrate 1 is preferably about from 100 µm to about 3,000 µm and more preferably from 400 µm to 1,000 µm. When the thickness of the substrate 1 is in these ranges, the strength is sufficiently high and occurrence of any splitting and the like tends to be avoided when the GaN crystal is produced. The shape of the substrate 1 is not especially limited while, taking the industrial applicability into consideration, the shape of the substrate 1 is, for example, a wafer-like shape whose diameter is about 50 to about 200 mm.

Using an MOCVD method, a thin film including a GaN single crystal not depicted is formed on the substrate 1 made of sapphire. The thickness of the thin film is preferably about from 0.5 µm to about 100 µm and more preferably from 1 µm to 5 µm. When the thickness of the thin film is 0.5 µm or larger, the formed thin film is an excellent single crystal and generation of any lattice defect and the like tends to be avoided in the acquired GaN crystal. The dislocation density of the GaN thin film formed on sapphire using the MOCVD method is generally about $10^7/cm^2$ to about $10^9/cm^2$. A buffer layer not depicted may be formed between the substrate 1 and the thin film. The buffer layer is a layer to buffer the difference in the lattice constant between sapphire and GaN to form a high quality GaN single crystal thin film on the substrate 1 made of sapphire. A material having a lattice constant that is close to those of sapphire and GaN is advantageously used for the buffer layer and the buffer layer may be a layer that includes a group III nitride such as GaN. For example, the buffer layer may be an amorphous layer or a poly-crystal layer that is grown using the MOCVD method at a relatively low temperature of 400° C. to 700° C. When this buffer layer is used, generation of any lattice defect and the like tends to be avoided in the GaN single crystal thin film formed on the buffer layer. The thickness of the buffer layer is preferably 10 nm to 50 nm and more preferably 20 nm to 40 nm. When the thickness of the buffer layer is 10 nm or larger, the buffering effect for the difference in the lattice constant is achieved and generation of any lattice defect and the like tends to thereby be avoided in the acquired GaN crystal. On the other hand, when the thickness of the buffer layer is excessively large, any information on the crystal lattice of the substrate 1 made of sapphire is lost and no good epitaxial growth can take place.

A portion of the thin film including the GaN single crystal is removed using a known method that uses photolithography and etching, and the plural GaN seed crystals 2 are formed. The shape of each of the GaN seed crystals 2 is, for example, a dot-like shape, and the size of the dot is preferably about 10 to about 1,000 µm and more preferably 50 to 300 m. The dots are arranged to substantially match with the crystal orientation (the a-axis or the m-axis) of GaN and are, for example, arranged at vertexes of regular triangles when seen from above. The arrangement of the dots is, for example, a triangle lattice not depicted. The expression "substantially match with" as used herein refers to the state not especially limited while this expression refers to the state, for example, where the difference between the axis of the triangle lattice and the crystal orientation is 10 degrees or smaller, and preferably 1 degree or smaller. The pitch of the dots is preferably an about 1.5-fold amount to an about 10-fold amount and more preferably a 2-fold amount to a 5-fold amount, of the dot size. The shape of the dot is, for example, a circular shape or a hexagonal shape. When the size, the arrangement, the pitch, and the shape of the dot(s) are each in the above corresponding ranges, the effects are achieved that the growth of the pyramids in the initial stage and the coupling of the GaN crystals with each other easily take place when the GaN crystals are grown using the flux method and that any dislocation inherited from any of the seed crystals can efficiently be reduced. The case of the triangle lattice as the arrangement of the dots has been taken as the example in the above while the arrangement is not limited to this. The arrangement of the dots may be, for example, a square lattice while the arrangement is, for example, the triangle lattice because the crystal system of the group III nitride crystal belongs to the hexagonal system. The dot-like shape as the shape of the seed crystal 2 has been taken as the example in the above while the shape is not limited to this. The shape of the seed crystal 2 may be, for example, a stripe shape, or a net-like shape acquired by applying negative-positive inversion to the dots. The shape of each of the plural first group III nitride crystals grown from the plural seed crystals 2 may be a shape other than the pyramid shape. An effect can be achieved that any dislocations inherited from any of the seed crystals can be reduced, by growing the GaN crystals such that their cross-sectional shapes in the thickness direction are each the triangular shape or the trapezoidal shape, on the seed crystals 2 in the initial stage of the growth of the GaN crystals using the flux method.

FIG. 3 depicts a schematic cross-sectional diagram of an example of the substrate 11 that includes the plural dot-shaped GaN crystals as the seed crystals 2 used in this embodiment.

(GaN Crystal Growth Step)

The GaN crystals 3 and 4 are formed on the GaN seed crystals 2 on the substrate 11 using the flux method. The GaN crystal growth step can be conducted, for example, as follows using the group III nitride crystal producing apparatus 100 depicted in FIGS. 1 and 2. The GaN crystal growth step includes a first GaN crystal growth step (FIG. 4) and a second GaN crystal growth step (FIG. 5).

(First GaN Crystal Growth Step)

As depicted in FIG. 1, the group III nitride crystal producing apparatus 100 includes a reaction chamber 103 formed using a stainless steel, a heat-insulating material, or the like, and a melting pot 102 is installed in the reaction chamber 103. A melting pot made of boron nitride (BN), alumina ($Al_2O_3$), or the like can be used as the melting pot 102. A heater 110 is arranged around the reaction chamber 103 and the heater 110 is designed to be able to adjust the temperature of the inside of the reaction chamber 103 and, especially, the inside of the melting pot 102. The group III nitride crystal producing apparatus 100 has a substrate holding mechanism 114 installed therein that is to hold the substrate 11 with the GaN seed crystals thereon, to be able to be lifted up and put down. A nitrogen supply line 113 to supply a nitrogen gas is connected to the reaction chamber 103, and the nitrogen supply line 113 is connected to a raw material gas cylinder not depicted or the like.

For growing the GaN crystals, Na to be the flux and Ga to be a group III element are first put in the melting pot 102 in the reaction chamber 103 of the group III nitride crystal producing apparatus 100. The input amounts of Na and Ga are, for example, about 85:15 to about 50:50 as the molar quantity ratios. In this case, small amounts of additives may be added optionally. When these work steps are conducted in the air, Na may be oxidized. Therefore, for example, these work steps may be conducted in the state where the work site is filled with an inert gas such as Ar or nitrogen. The inside of the reaction chamber 103 is sealed up and the temperature of the melting pot is adjusted to be not lower than or equal to 800° C. and not higher than or equal to 1,000° C. and more preferably not lower than or equal to 850° C. and not higher than or equal to 950° C. and a nitrogen gas is sent into the reaction chamber 103. At this time, the gas pressure in the reaction chamber 103 is set to be not lower than or equal to $1\times10^6$ Pa and not higher than or equal to $1\times10^7$ Pa, and more preferably not higher than or equal to $3\times10^6$ Pa and not higher than or equal to $5\times10^6$ Pa. Nitrogen tends to be more dissolved in Na melted at a high temperature by increasing the gas pressure in the reaction chamber 103, and the GaN crystals can be grown at a high rate by setting the temperature and the pressure as above. Na, Ga, and the small amounts of additives are retained or are stirred to be mixed with each other until these components are uniformly mixed with each other. The retention or the stirring for mixing is conducted for preferably 1 to 50 hours and more preferably 10 to 25 hours. When the retention or the stirring for mixing is conducted for the above time period, Na, Ga, and the small amounts of additives can uniformly be mixed with each other. In this case, when the substrate 11 is brought into contact with the melt 12 of Na and Ga whose temperature is lower than a predetermined temperature or that is not uniformly mixed, etching of the GaN seed crystals 2, crystallization of low quality GaN crystals, and the like may occur. Therefore, for example, the substrate 11 may be held in the upper portion of the reaction chamber 103 by the substrate retention mechanism 114.

As depicted in FIG. 2, the substrate 11 is immersed in the melt 12. The melt 12 may be stirred and the like during the immersion. For the stirring of the melt 12, the melting pot 102 may physically be moved by being shaken, rotated, or the like, or the melt 12 may be stirred using a stirrer, a stirring blade, or the like. A heat gradient may be generated in the melt 12 and the melt 12 may be stirred using the thermal convection caused thereby. The stirring enables the state where the concentrations of Ga and N are uniform in the melt 12 to be maintained and also enables the crystals to stably be grown. Ga and the dissolved nitrogen in the melt 12 react with each other on the surface of each of the GaN seed crystals 2 and the GaN single crystal is epitaxial-grown on each of the GaN seed crystals 2. In this state, the immersion in the melt 12 is conducted for a specific time period to grow the crystals, and the first GaN crystals 3 whose cross-sections depicted in FIG. 4 each have a triangular shape or a trapezoidal shape and, for example, a pyramid shape can thereby be acquired. The dislocations inherited from the seed crystals 2 formed using the MOCVD method and having dislocation density of about $10^7/cm^2$ to about $10^9/cm^2$ can be converged in the vertex portions of the pyramids by growing the GaN crystals each in the pyramid shape. To excellently conduct the conversion of the dislocations and the second GaN crystal growth step to be conducted next, for example, the first GaN crystal growth may be conducted to the extent that the pyramids grown from the plural seed crystals 2 are coupled with each other exactly at the end portions of the bottom faces of at least some of the pyramids as depicted in FIG. 4. This is because, when the pyramids are not coupled with each other, GaN crystals each including many dislocations grow at these portions during the second GaN crystal growth that is conducted next. Therefore, for example, the second GaN crystal growth to be conducted next may be conducted after the pyramids are coupled with each other at the end portions of the bottom portions of at least some of the pyramids. The second GaN crystal growth may be conducted after the coupling of the end portions of the bottom portions of the pyramids with each other is further advanced and the end portions of the bottom portions are substantially coupled with each other.

Figure 12:
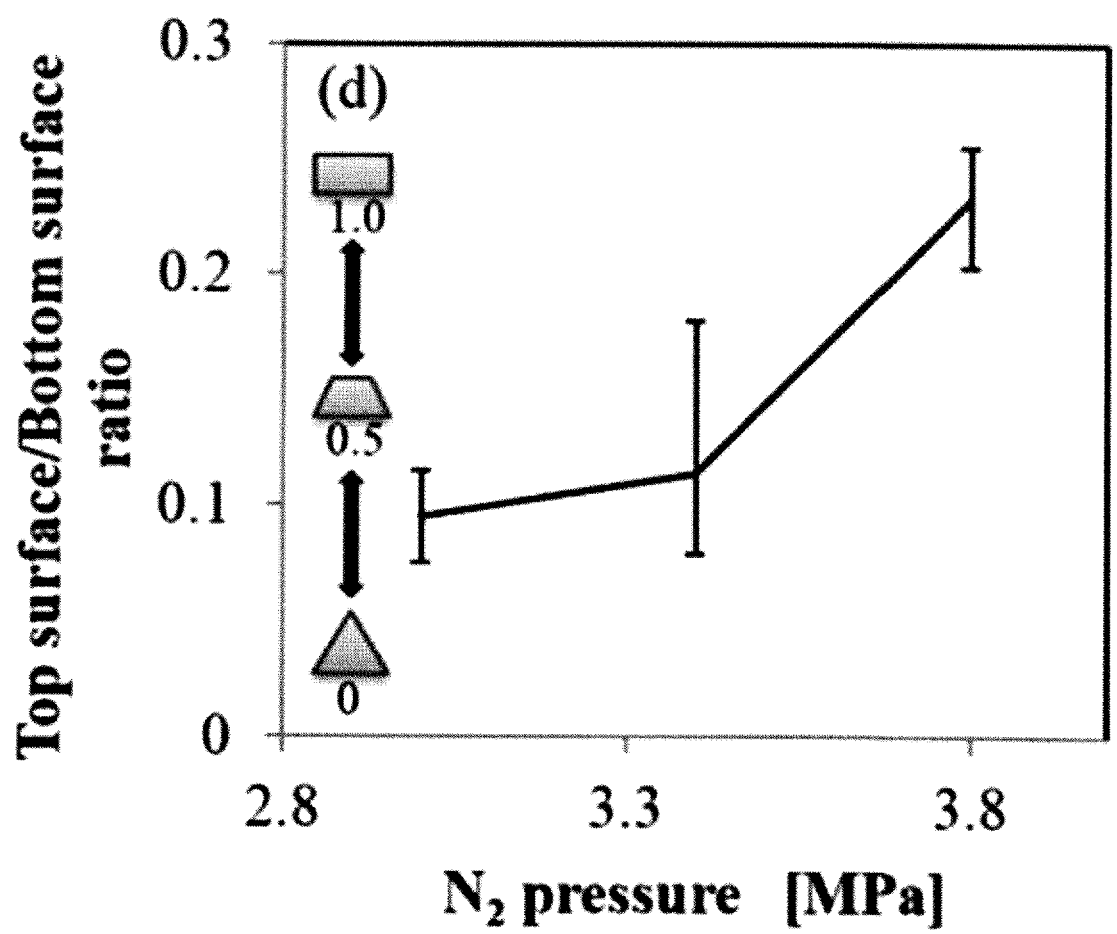
FIG. 12 is a chart of the relation between a crystal growth condition and a cross-sectional shape of a growing crystal in the production method for a group III nitride crystal according to the first embodiment of present disclosure.

FIG. 12 is a chart of an example of data of dependence of the crystal growth direction by the nitrogen pressure condition. From FIG. 12, it can be seen that the cross-sectional shape of the GaN crystal grown using the flux method depends on the nitrogen pressure, and the shape becomes the pyramid shape at a low pressure and the trapezoidal shape at a high pressure. Because the nitrogen pressure influences the concentration of nitrogen dissolved in the melt, it can be considered that the above variation of the shape depends on the degree of supersaturation of GaN in the melt. The degree of supersaturation depends on not only the nitrogen pressure but also the temperature, and becomes a high degree of supersaturation at a low temperature and a low degree of supersaturation at a high temperature. The nitrogen pressure and the temperature of the first GaN crystal growth step are therefore properly set in the above ranges for the GaN crystals to be grown to each have the pyramid shape.

(Second GaN Crystal Growth Step)

The states in FIGS. 1 and 2 are alternately repeated for the substrate 11 that has the first GaN crystals 3 grown thereon whose cross-sections each have the triangular shape or the trapezoidal shape. The second GaN crystals 4 are each grown in a gap among the first GaN crystals 3 whose cross-sections each have the triangular shape or the trapezoidal shape as depicted in FIG. 5 by repeating the immersion (FIG. 2) and the lifting up (FIG. 1) of the substrate 11 in/from the melt 12 for plural times. The second GaN crystals 4 are grown such that the surface is made flat by burying the gaps among the first GaN crystals 3. In this case, the point is the lifting up of the substrate 11 from the melt 12 as depicted in FIG. 1. As above, the degree of supersaturation needs to be large to realize the growth mode for the gaps among the first GaN crystals 3 to be buried. On the other hand, setting the degree of supersaturation to be large is enhancing the driving force for the growth of the crystals, and a large amount of GaN poly-crystal is generated in the interface between the melt 12 and the melting pot 102 and in the portion in contact with the substrate holding mechanism 114. A problem therefore arises that the growth of the GaN single crystals on the substrate 11 is obstructed. The inventors repeatedly conducted experiments in the state where the substrate 11 is immersed in the melt 12, varying the values of the nitrogen pressure and the temperature each to various values. The inventors were however unable to suppress the generation of the poly-crystal and grow any excellent GaN single crystals realizing the growth mode for the surface to be made flat by burying the gaps among the first GaN crystals 3 whose cross-sections each have the triangular shape or the trapezoidal shape.

On the other hand, it is known that the nitrogen concentration in the melt 12 is higher at a point closer to the surface of the melt 12 because nitrogen is dissolved from the surface of the melt 12, and it is therefore effective to grow the GaN crystals at the position ultimately close to the surface of the melt to realize a high degree of supersaturation. It is however highly difficult to hold the substrate 11 at the position ultimately close to the surface of the melt highly precisely and for a long time period, in a container at a high temperature and a high pressure and in the situation where the growth of the crystals and the consumption of the raw materials concurrently take place. The inventors considered that a thin coating film of the melt would be formed on the surface of the substrate 11 by lifting up the substrate 11 from the melt 12 after immersing the substrate 11 therein, and conducted experiments. As a result, the inventors succeeded in realizing the growth mode for the surface to be made flat by burying the gaps among the first GaN crystals 3 even at the nitrogen pressure and under the temperature condition for setting a low degree of supersaturation that suppressed the generation of any poly-crystal. On the other hand, it also turned out that the above caused the GaN crystals to be grown from the melt in the form of the coating film and Ga in the melt was exhausted as the crystals grew resulting in discontinuation of the growth. The inventors therefore conceived the second GaN crystal growth step of repeatedly conducting the immersion and the lifting up of the substrate 11 in/from the melt 12 for plural times, to realize the growth thickness necessary for burying the gaps among the first GaN crystals 3, and the inventors thereby completed the present disclosure. The second GaN crystals 4 each having the flat surface were able to be acquired by, for example, repeatedly conducting the immersion and the lifting up of the substrate 11 in/from the melt 12 for 50 to 500 times.

In addition to the method of lifting up and putting down the substrate in the up-and-down direction as above, methods of shaking the overall melting pot, rotating the melting pot in the state where the melting pot is inclined, and the like can be considered as the method for repeatedly conducting the immersion and the lifting up thereof in/from the melt. With these methods, problems however arise that are generation of poly-crystals due to the fiercely shaken melt and degradation of the temperature distribution due to the asymmetry of the thermal convection around the melting pot for the vertical axis. The method of lifting up and putting down the substrate in the up-and-down direction is more advantageously used.

For example, the substrate 11 may be inclined against the liquid level of the melt 12 by about 1 to about 15 degrees to stably form the coating film-like melt on the overall surface of the substrate 11. The thickness of the coating film can be controlled to be an advantageous thickness by the balance of the surface shape of the substrate 11, the surface tension of the melt 12, and the gravitational force, by inclining the substrate 11 in the above range. Associated with this, any accumulation of the melt on the substrate 11 can be suppressed. As depicted in FIG. 1, the substrate 11 may always be inclined against the liquid level of the melt 12. Otherwise, the substrate 11 may be inclined against the liquid level of the melt 12 at least once in the time period for the substrate 11 to be kept lifted up from the melt 12.

Other Examples

Figure 10:
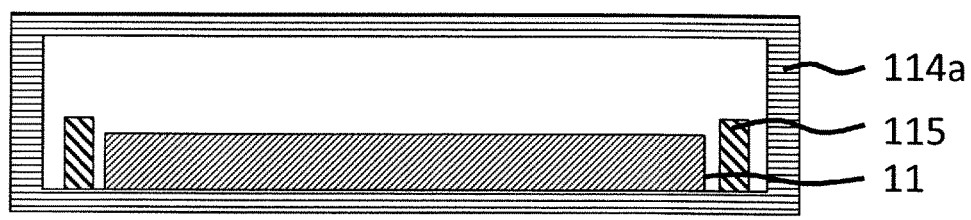
FIG. 10 is a schematic cross-sectional diagram of a melt retention mechanism of another example of a part that retains the melt in a producing apparatus for a group III nitride crystal used in the first embodiment of present disclosure.
Figure 11:
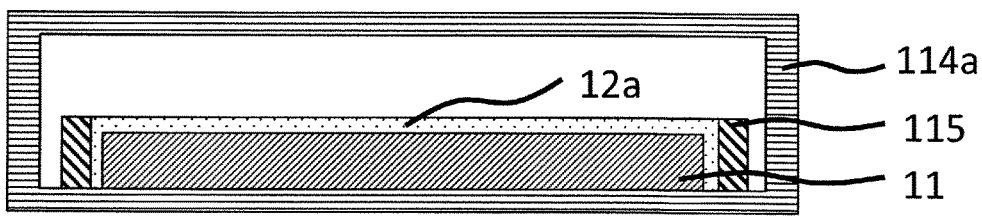
FIG. 11 is a schematic cross-sectional diagram of the state where the melt is retained in the melt retention mechanism of FIG. 10.

FIG. 10 is a schematic cross-sectional diagram of a melt retention mechanism 115 of another example of a part that retains the melt 12 in the producing apparatus for a group III nitride crystal used in the first embodiment. FIG. 11 is a schematic cross-sectional diagram of the state where a melt 12a is retained in the melt retention mechanism 115 of FIG. 10. As depicted in FIGS. 10 and 11, the melt retention mechanism 115 may be disposed that adjusts the melt 12a on the substrate 11 to have a predetermined thickness. As depicted in FIGS. 10 and 11, the melt retention mechanism 115 may be a peripheral wall surrounding the substrate 11 and may be a peripheral wall that is higher than the surface of the substrate 11 by the amount corresponding to the thickness of the coating film-like melt 12a to be disposed. In this case, a substrate holding mechanism 114a only has to accommodate the substrate 11 and the melt retention mechanism 115, and the substrate 11 does not need to be inclined against the liquid level of the melt 12 in the melting pot 102. For example, in the same manner as that in the above, the substrate holding mechanism 114 is immersed in the melt 12 in the melting pot 102 in the reaction chamber 103 and the melt 12a can thereby be introduced into the peripheral wall of the melt retention mechanism 115, as the method of causing the melt retention mechanism 115 to retain the melt 12a. The difference between this case and the case of FIG. 12 is that the substrate holding mechanism 114a is not inclined against the liquid level of the melt 12 in the melting pot 102.

For the time period for the substrate 11 to be immersed in the melt 12 and the time period for the substrate to be kept lifted up from the melt 12, for example, the time period for the substrate 11 to be immersed in the melt 12 at a low degree of supersaturation may be set to be as short as possible based on the above mechanism. On the other hand, it is efficient that the time period for the substrate 11 to be kept lifted up from the melt 12 is set to be the time period for Ga in the coating film-like melt to be exhausted. For example, the time period for the immersion is preferably 0 to 30 minutes and the time period for keeping the substrate lifted up is preferably 1 to 60 minutes. The "time period for the immersion of 0 minute" means the case where the substrate 11 is immersed in the melt 12 and is thereafter immediately lifted up therefrom. In this case, the substrate 11 is immersed in the melt 12. The "0 minute" therefore means that the time period for the substrate 11 to stay in the melt 12 is substantially 0 minute. For example, this 0 minute means the state where, after the substrate 11 reaches the lower side of the liquid level of the melt 12, the substrate 11 is immediately lifted up. This 0 minute may therefore include, for example, a time period in seconds. The temperature for the second GaN crystal growth step is set to be preferably higher than the temperature for the first GaN crystal growth step by, for example, about 3 to about 50° C. to suppress generation of any poly-crystal.

When the second GaN crystals 4 are observed using a cathode luminescence method, as depicted in FIG. 5, plural layers are observed along the slope of each of the first GaN crystals 3 whose cross-sections each have the triangular shape or the trapezoidal shape. The second GaN crystals 4 are high quality GaN single crystals. Cyclic slight differences in the impurity concentration are present in each of the crystals, associated with the sessions of the immersion and the lifting up in/from the melt 12 due to the variation of the Ga concentration in the coating film-like melt during their growth. It is therefore considered that the cyclic differences in the impurity concentration may be observed as the layers.

(Third GaN Crystal Growth Step)

Figure 6:
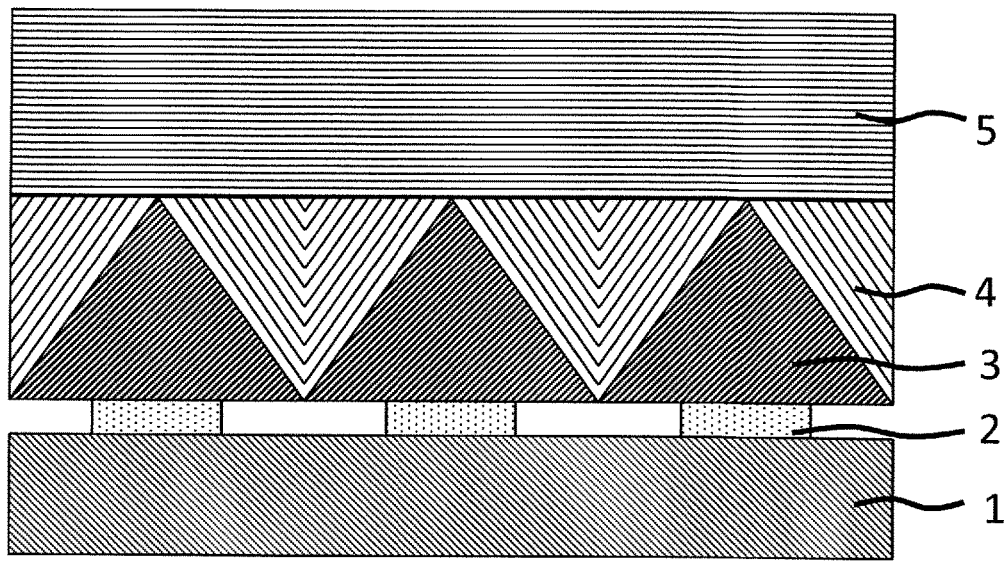
FIG. 6 is a schematic cross-sectional diagram of a step of the production method for a group III nitride crystal according to the first embodiment of present disclosure.

As depicted in FIG. 6, a third GaN crystal 5 having a desired thickness can be grown when necessary on the GaN crystals 3 and 4 whose surfaces are made flat at the second GaN crystal growth step. When the third GaN crystal 5 is grown to be thick, any warpage and any crack can be suppressed. For example, when the thickness of the GaN crystals (the total of 3, 4, and 5) is smaller than that of the substrate 1 made of sapphire, cracks tend to be generated in the GaN crystals. Generation of any crack in the GaN crystals 3, 4, and 5 can therefore be suppressed by setting the film thickness of the third GaN crystal 5 to be large. The third GaN crystal growth step is in the growth mode to form a flat crystal surface, and is a step of growing the flat GaN crystal to be thick. Therefore, for example, the third GaN crystal growth step may be conducted by immersing the substrate 11 in the melt 12 putting importance on the growth rate and the growth time period. The dislocation density in the third GaN crystal 5 becomes $10^6/cm^2$ or lower by converging the dislocations using the first GaN crystals 3.

After the third GaN crystal growth step comes to an end, the temperature and the pressure need to be recovered to be the normal temperature and the normal pressure to take out the GaN crystals 3, 4, and 5. At the time of recovering these conditions, the degree of supersaturation of the melt 12 is significantly varied and, when the substrate 11 is left immersed therein, etching of the grown GaN crystals and crystallization of low quality GaN crystals occur. Therefore, for example, after the third GaN crystal growth step comes to an end, the temperature and the pressure may be recovered to be the normal temperature and the normal pressure in the state where the substrate 11 is lifted up from the melt 12.

(Separation Step)

Figure 7:
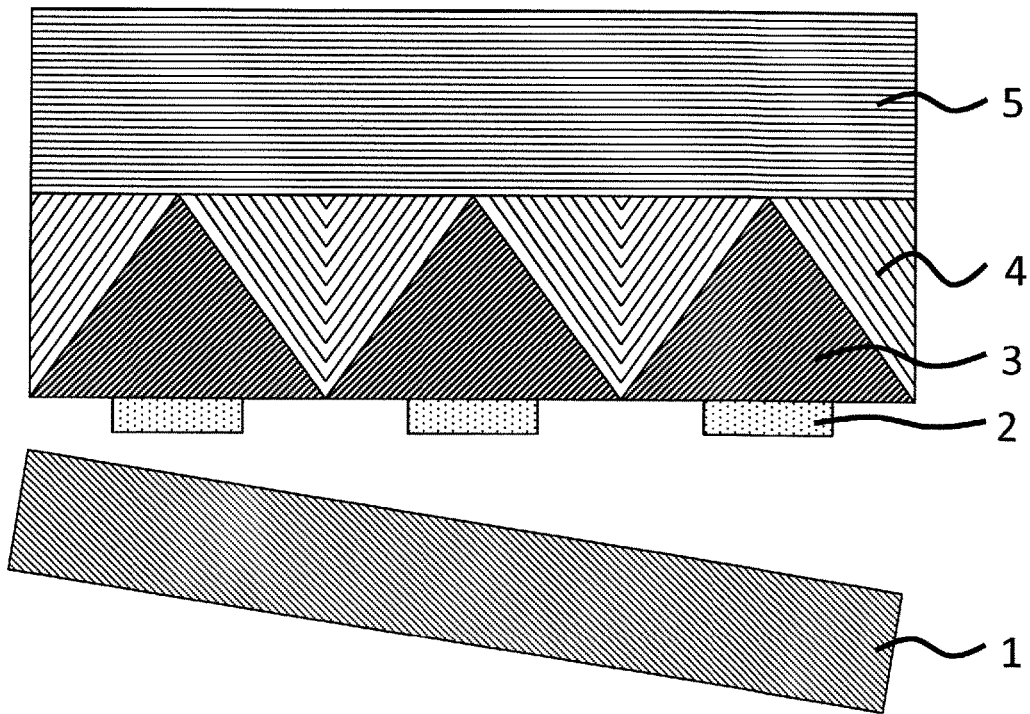
FIG. 7 is a schematic cross-sectional diagram of a step of the production method for a group III nitride crystal according to the first embodiment of present disclosure.

As depicted in FIG. 7, the GaN crystals 3, 4, and 5 having the desired thickness and the substrate 1 made of sapphire may finally be separated from each other in the vicinity of each of the GaN seed crystals 2. For example, the coefficient of thermal expansion differs between the GaN crystals 3, 4, and 5, and the substrate 1 made of sapphire in the range from the crystal growth temperature of 850 to 950° C., to the normal temperature. In the course of the cooling to the normal temperature, separation can be conducted in the vicinity of each of the GaN seed crystals 2 whose cross-sectional areas are each small and that each tend to be broken, by using the difference in the coefficient of thermal expansion between the GaN crystals 3, 4, and 5, and the substrate 1 made of sapphire. The large-sized GaN crystals 3, 4, and 5 can thereby be acquired whose warpage and cracks are suppressed.

Figure 8:
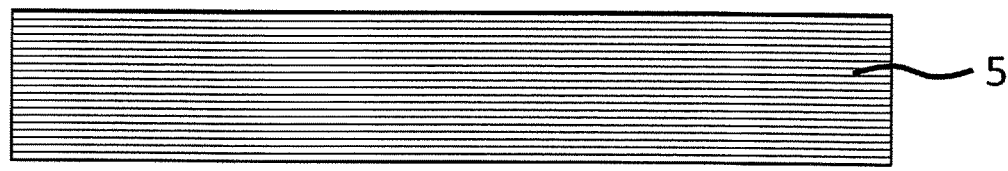
FIG. 8 is a schematic cross-sectional diagram of a step of the production method for a group III nitride crystal according to the first embodiment of present disclosure.
Figure 9:
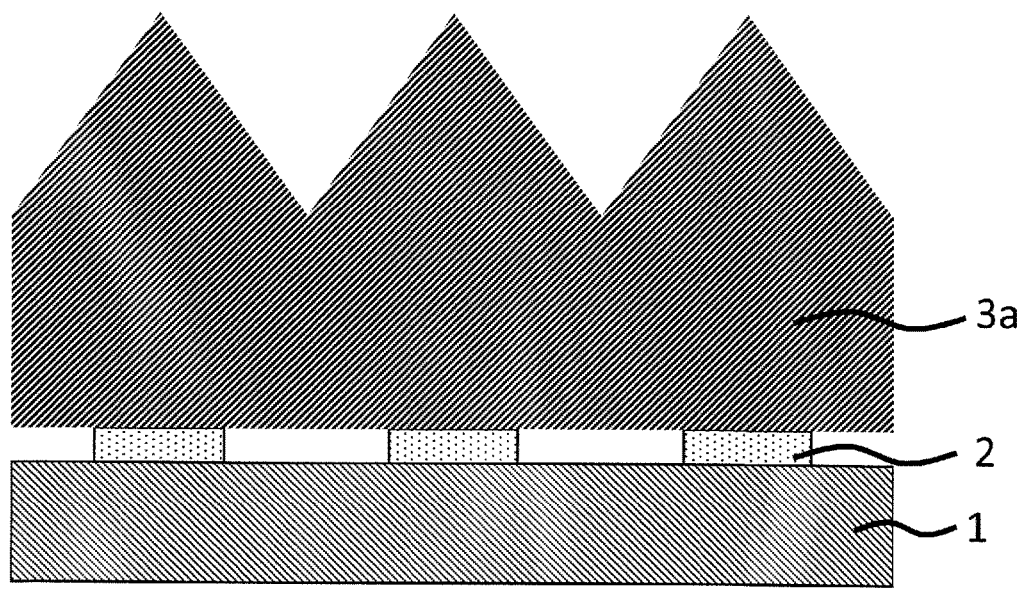
FIG. 9 is a schematic cross-sectional diagram of an example of a traditional production method for a group III nitride crystal.

As depicted in FIG. 8, the GaN crystal 5 having a large diameter can be produced by removing the GaN seed crystals 2 and the GaN crystals 3 and 4 from the acquired large-sized GaN crystals 3, 4, and 5 and further polishing the surface thereof (the upper side in FIG. 8). Inclusion of any high dislocation region can be suppressed by removing the GaN seed crystals 2 and the GaN crystals 3 and 4. For the GaN crystal 5, the growth mode for the inclined surface such as a (10-11) surface to be externally exposed can be suppressed and the impurity concentration can be set to be low, by conducting the crystal growth on the flat face.

Other Embodiments

In the above embodiment, when the small amounts of additives are added together with Na and Ga, the electric conductivity and the bandgap of the acquired GaN can be adjusted. Examples of the small amounts of additives include a compound including at least one element selected from the group of boron (B), thallium (Tl), and calcium (Ca). Further, the examples may include silicon (Si), sulfur (S), selenium (Se), tellurium (Te), carbon (C), oxygen (O), aluminum (Al), indium (In), alumina ($Al_2O_3$), indium nitride (InN), silicon nitride ($Si_3N_4$), silicon oxide ($SiO_2$), indium oxide ($In_2O_3$), zinc (Zn), magnesium (Mg), zinc oxide (ZnO), magnesium oxide (MgO), germanium (Ge), or the like. Only one of these small amounts of additives may be added alone, or two or more thereof may be added.

The form that uses Na as the flux has been described in the above while the present disclosure is not limited to the above and an alkali metal other than Na may be used. For example, a mixture flux may be used that includes at least one selected from the group consisting of Na, Li, K, Rb, Cs and Fr, and Li such as, for example, Na and Li, or the like.

The form of producing the GaN crystals as the group III nitride has been described in the above while present disclosure is not limited to this. The group III nitride of present disclosure may be a binary, a ternary, or a quaternary compound that includes a group III element (Al, Ga, or In). The group III nitride thereof may be a compound that is represented by, for example, a general formula $Al_{1-x-y}Ga_yIn_xN$ (where x and y satisfy $0 \leq x \leq 1$, $0 \leq y \leq 1$, and $0 \leq 1-x-y \leq 1$). The group III nitride may include an impurity of a "p" type or an "n" type. GaN has been described as the raw material also for the group III nitride seed crystals while the above compounds can each be used as the raw material thereof.

Present disclosure includes proper combination of any optional embodiment(s) and/or any optional Example(s), of the above various embodiments and/or Examples, and the effects to be achieved by these combined embodiment(s) and/or the Example(s) can be achieved.

A high quality and large-sized group III nitride crystal whose surface is flat can be acquired by using the production method for a group III nitride crystal according to present disclosure. For example, an LED element or the like of the group III nitride crystal with reduced unevenness of light emission and alleviated reduction of the brightness can be fabricated with a high yield and at a low cost.

EXPLANATIONS OF LETTERS OR NUMBERS 1 substrate
2 seed crystal
3, 3a first group III nitride crystal (having a pyramid shape)
4 second group III nitride crystal (plural group III nitride crystal layers)
5 third group III nitride crystal (flat thick film growth part)
11 substrate
12, 12a melt
21 group III nitride crystal
100 group III nitride crystal producing apparatus
102 melting pot
103 reaction chamber
110 heater
113 nitrogen supply line
114, 114a substrate holding mechanism
115 melt retention mechanism

What is claimed is:

1. A method for producing a group III nitride crystal, the method comprising:
    preparing a plurality of group III nitride pieces as a plurality of seed crystals on a substrate; and
    growing a group III nitride crystal by bringing a surface of each of the seed crystals into contact with a melt that comprises at least one group III element selected from the group consisting of gallium, aluminum, and indium, and an alkali metal in an atmosphere comprising nitrogen, and thereby reacting the group III element and the nitrogen in the melt,
    wherein the step of growing a group III nitride crystal comprises:
        growing a plurality of first group III nitride crystals whose cross-sections each have a triangular shape or a trapezoidal shape, on the basis of the plurality of seed crystals; and
        growing second group III nitride crystals each in a gap among the plurality of first group III nitride crystals,
    wherein at the step of growing second group III nitride crystals, a plurality of group III nitride crystal layers are formed on an inclined surface of each of the first group III nitride crystals that are formed at the step of growing a plurality of first group III nitride crystals.

2. The method for producing a group III nitride crystal according to claim 1, wherein at the step of growing first group III nitride crystals, the substrate is immersed in the melt, and
    wherein at the step of growing second group III nitride crystals, the immersion and a lifting up of the substrate in/from the melt are repeated for a plurality of times.

3. The method for producing a group III nitride crystal according to claim 2, wherein at the step of growing second group III nitride crystals, a time period for the substrate to be immersed in the melt is shorter than a time period for the substrate to be kept lifted up from the melt.

4. The method for producing a group III nitride crystal according to claim 2, wherein at the step of growing second group III nitride crystals, the substrate is lifted up above and put down under a liquid level of the melt in a state where the substrate is inclined against the liquid level of the melt.

5. The method for producing a group III nitride crystal according to claim 2, wherein at the step of growing second group III nitride crystals, the substrate is inclined against a liquid level of the melt at least once in a time period during which the substrate is kept lifted up from the melt.

6. The method for producing a group III nitride crystal according to claim 2, wherein at the step of growing second group III nitride crystals, a thickness of a coating film of the melt present on the substrate is controlled to be a specific amount in a time period for the substrate to be kept lifted up from the melt.

7. The method for producing a group III nitride crystal according to claim 1, wherein the step of growing a group III nitride crystal further comprises growing a third group III nitride crystal whose surface is flat, after the step of growing second group III nitride crystals.

8. The method for producing a group III nitride crystal according to claim 7, wherein at the step of growing a third group III nitride crystal, the substrate is immersed in the melt.

9. The method for producing a group III nitride crystal according to claim 1, further comprising, after the step of growing a group III nitride crystal,
    separating the group III nitride crystals and the substrate from each other in a vicinity of each of the seed crystals.

10. The method for producing a group III nitride crystal according to claim 1, wherein the step of growing a plurality of first group III nitride crystals is continuously conducted until the plurality of first group III nitride crystals are coupled with each other in at least some of bottom face end portions thereof.

11. The method for producing a group III nitride crystal according to claim 1, wherein the step of growing second group III nitride crystals is conducted after the plurality of first group III nitride crystals are coupled with each other in at least some of bottom face end portions thereof.

* * * * *